United States Patent
Litvak

(10) Patent No.: US 8,462,027 B2
(45) Date of Patent: Jun. 11, 2013

(54) SELECTIVE DATA COMPRESSION

(75) Inventor: Oleg Litvak, Ariel (IL)

(73) Assignee: Dialogic Networks (Israel) Ltd., Petach Tikva (IL)

( * ) Notice: Subject to any disclaimer, the term of this patent is extended or adjusted under 35 U.S.C. 154(b) by 54 days.

(21) Appl. No.: 13/255,188

(22) PCT Filed: Mar. 23, 2010

(86) PCT No.: PCT/IL2010/000239
§ 371 (c)(1),
(2), (4) Date: Sep. 7, 2011

(87) PCT Pub. No.: WO2010/109456
PCT Pub. Date: Sep. 30, 2010

(65) Prior Publication Data
US 2012/0001777 A1    Jan. 5, 2012

(30) Foreign Application Priority Data

Mar. 24, 2009    (IL) .......................................... 197882

(51) Int. Cl.
*H03M 7/30*    (2006.01)
(52) U.S. Cl.
USPC .............................................. 341/87; 341/51

(58) Field of Classification Search
USPC .............. 341/50, 51, 87; 375/E7.088, E7.145
See application file for complete search history.

(56) References Cited

U.S. PATENT DOCUMENTS

| | | | |
|---|---|---|---|
| 5,177,480 A | | 1/1993 | Clark |
| 5,627,533 A | * | 5/1997 | Clark .............................. 341/51 |
| 5,648,773 A | | 7/1997 | Guy |
| 6,289,130 B1 | | 9/2001 | Cooklev |
| 7,263,233 B2 | | 8/2007 | He |
| 7,460,032 B2 | * | 12/2008 | Boldt et al. ...................... 341/50 |
| 7,692,560 B2 | * | 4/2010 | Garakani et al. ................ 341/51 |

* cited by examiner

*Primary Examiner* — Brian Young
(74) *Attorney, Agent, or Firm* — Preti Flaherty Beliveau & Pachios LLP

(57) ABSTRACT

A method and apparatus are described for determining whether to convey a communication signal in a compressed form along a communication path. The method comprises the steps of: (i) providing the communication signal that should be conveyed along said communication path; (ii) determining whether at least part of the communication signal comprises data having a non-random distribution; (iii) if the at least part of the communication signal is determined to comprise data having at least partially a non-random distribution, applying a compression algorithm onto that at least part of the communication signal to form a compressed form of the communication signal provided; and (iv) conveying the communication signal in its compressed form along the communication path.

13 Claims, 1 Drawing Sheet

SELECTIVE DATA COMPRESSION

FIELD OF THE INVENTION

The present invention relates in general to telecommunication systems and methods for efficiently transmit data in these systems, and particularly to systems and methods for determining whether certain signals can be transmitted in their compressed form.

BACKGROUND OF THE INVENTION

Communication has moved in the recent decades towards digital networks carrying voice, facsimile, data and video signals. With the vast amount of data being exchanged over communications networks, it is apparent that data compression is a useful feature in these networks to increase the operation efficiency by transmitting the signals in a compressed form, thereby using the available bandwidth to simultaneously transmit more information. The cost and time savings as well as the benefit of having a faster connection are not negligible and are highly desirable, resulting in a constant demand for better and improved lossless data compression algorithms.

Data compression is a technique wherein a signal, or computer data which requires a certain number of bits for its representation, is represented or encoded, using a fewer number of bits. The ratio between the number of bits required for representing the original signal to the number of bits required by the encoded signal is known as the compression ratio. The complimentary process in which the signal or computer data is expanded and reconstructed to form its original representation is called decompression, decoding or reconstruction.

Data compression is a technology which has matured during the recent decades and comprises two major types of compression: lossy and lossless. In a lossy compression type of system, portions of the data that are determined to be less necessary are discarded making exact reconstruction or decompression of the signal impossible. Lossy compression is employed for physical signals such as speech, audio, images and video in which exact reconstruction of the original signal is usually not required for perceptive acceptability. Since such signals as those immediately described above are generally destined for human perception, such as by the human auditory or visual senses, minor differences between the original and reconstructed signals may either be undetected by human senses or tolerable in their degraded state.

In contrast, lossless compression enables an exact reconstruction of the original signal to be performed upon decompression. In other words, lossless compression achieves a perfect recreation of the original signal without the degraded or compromised characteristics of lossy compression techniques. One of the penalties of employing lossless compression is that the compression ratio or the ability to compress a large number of data bits into a smaller number of data bits is greatly reduced. For certain types of data information, it is imperative that perfect reconstruction of lossless data compression be employed rather than the compromised reconstruction approach characteristic of lossy compression techniques. For example, computer data must be precisely reconstructed otherwise disastrous effects might occur.

In U.S. Pat. No. 6,289,130 a data compression scheme is described which provides an algorithm to determine when as well as how to efficiently switch between transparent and compressed modes to provide and facilitate an improved compression ratio. Additionally, a temporary buffer is provided for use by the encoder in determining which of either transparent or compressed mode provides a more efficient transfer of a portion of data. In making a determination to transition between transmit modes, the incurred overhead associated with such transitions is also taken into account.

U.S. Pat. No. 5,177,480 describes a method of processing data for transmission from a transmitter to a receiver both of which are switchable between a compression mode in which the data stream is encoded by using a data compression algorithm and a transparent mode in which the data stream is transmitted in its non-encoded form. The method described comprises reading an input data stream at the transmitter, encoding at least part of the input data stream with the data compression algorithm to form a compressed data stream, monitoring the efficiency of compression of the compressed data stream and controlling the switching of the mode of the transmitter so that the input data stream is transmitted efficiently. In the transparent mode both the receiver and the transmitter check independently the efficiency of compression and switch to the compression mode if the transparent mode is determined to be inefficient. In the compression mode the transmitter determines the efficiency of compression and transmits a control code to the receiver, switching both the receiver and transmitter to the transparent mode if the compression mode is determined to be inefficient.

U.S. Pat. No. 5,648,773 discloses synchronized transmitter and receiver of a data compression transmission system which is operative to switch, when a compression is no longer effective, from a first data compression mode of operation to a second mode of operation called release mode and according to which the data are transmitted or received directly without compression or decompression, for the transmission and reception, respectively, of a predetermined number of data.

U.S. Pat. No. 7,263,233 describes an encoder which is operative in a compressed or a transparent mode that switches from one mode to the other based upon a data compressibility test. The test comprises comparing an N-segment sliding average of the number of bits required by the encoder in compressed mode to represent a segment of a fixed number of characters to the number of bits required by the encoder in transparent mode to represent the segment.

As may be appreciated, the decisions on whether to apply compression onto the received signal that are taken in accordance with the prior art methods, are typically based upon a prior attempt to compress at least part of the received signal to be transmitted (test signal), and upon determining the compression effect on that test signal, to take a decision on whether to transmit the signal in a compressed form or not. Some of the drawbacks associated with these prior art methods are, the need to go through the various steps of compression for at least a part of the received signal in order to establish the compression effect, and consequently waste compression resources, particularly if the signal is eventually determined to be a non-compressible signal.

Furthermore, in modern compressors another problem arises from the fact that once the test signal, which is, as previously explained, at least a part of the original signal (or the whole original signal itself), is compressed but the final decision is that the signal should not be transmitted in its compressed form, there is no way for the compressing machine to resume its preceding state (i.e. the state prior to its operating upon the test signal). Thus, for such cases, further resources must be utilized for duplicating and storing the compressor state prior to applying the compression upon the test signal, to enable the transmission of the signal in the non-compressed form.

The present invention is therefore directed to overcome such problems, and to provide a method for determining whether a signal that should be forwarded along a transmission path, can be transmitted essentially in a compressed form.

SUMMARY OF THE INVENTION

It is therefore an object of the present invention to provide a means for determining whether signals should be transmitted in a transparent or a compressed mode, and possibly, if in a compressed mode, to determine the appropriate compression algorithm.

It is a further object of the present invention to provide methods and computer readable media for achieving the foregoing.

Other objects of the invention will become apparent as the description of the invention proceeds.

In accordance with an embodiment of the present invention, there is provided a method for determining whether to convey a communication signal in a compressed form along a communication path extending in a communications network, wherein the method comprises the steps of:

providing the communication signal that should be conveyed along the communication path;

determining whether at least part of the communication signal comprises data having a non-random distribution;

if the at least part of the communication signal is determined to comprise data having at least partially a non-random distribution, applying a compression algorithm onto that at least part of the communication signal to form a compressed form of the communication signal provided; and conveying the communication signal in its compressed form along the communication path.

The term "determining whether to convey a communication signal in a compressed form" is used herein to denote whether a compression algorithm should be applied onto the communication signal or not, and possibly if in the affirmative, i.e. if such a compression algorithm should be applied, determining the type of the compression algorithm to be used.

According to an embodiment of the invention the communications network is a packet switched network and the at least part of the communication signal is at least a part of one packet.

In accordance with still another embodiment, the step of determining whether the at least part of communication signal comprises data having at least partially a non-random distribution includes applying accumulative statistics onto said at least part of the communication signal, thereby enabling to establish whether the data comprised therein is randomly or non-randomly distributed within that at least part of the communication signal.

According to another embodiment of the invention, the step of determining whether the at least part of the communication signal comprises data having at least partially non-random distribution includes determining whether the distribution of the data comprised in the at least part of the communication signal, exceeds a certain threshold of non-random distribution. More preferably, the step of determining whether the distribution of the data comprised in the at least part of communication signal has at least partially a non-random distribution, includes providing a plurality of thresholds of non-random distributions, determining which of these thresholds are exceeded by the distribution of data comprised in the at least part of communication signal, and based on the exceeded threshold(s), establishing a compression algorithm to be used for compressing the at least part of the communication signal.

As will be appreciated by those skilled in the art, although the application of a compression algorithm onto the at least part of the communication signal is based upon determining that the distribution of data in that at least part of the signal is characterized by having at least some degree of non-random distribution, still it should be obvious to those skilled in the art that there might be cases (even though that they are rare cases) where compressible signals will not be compressed in accordance with the present invention, as their distribution according to the method provided by the present invention is considered to be a random distribution, such as a counter signal, and the like.

Although in quite a few cases the threshold(s) that are used to determine whether the at least part of the signal has a non-random distribution of data, is a pre-defined threshold, still, according to a preferred embodiment of the present invention, the threshold(s) is/are adaptive threshold(s) which vary in accordance with the available resources, e.g. the available bandwidth for conveying the at least part of the communication signal towards its destination, available processing resources, and the like.

Although the communication signal according to the present invention is preferably a data type of signal, e.g. computer files, etc., still it may represent for example signals of various types such as voice, video etc. in a packetized form, which are treated as data type of signals.

By yet another embodiment of the invention, the step of determining whether the at least part of the communication signal comprises data having a non-random distribution, comprises:

counting the number of instances that at least one symbol (or at least one combination of symbols) is comprised within the at least part of the communication signal (e.g. how many times does the symbol representing the English letter "A" appears in the data payload of the at least part of the communication signal); and if the total number of instances that the at least one symbol is comprised within the at least part of the communication signal matches a pre-defined criterion, determining that the at least part of the communication signal comprises data in a non-random distribution.

As will be appreciated by those skilled in the art, the present invention should be understood to encompass counting the appearances of a certain symbol in the at least part of the communication signal, or counting the appearances of a number (or each) of the symbols that are comprised in the at least part of the communication signal, or the appearances of one or more combinations of two or more symbols each, or any combination thereof, each and all of which will be referred to hereinafter as counting the numbers that at least one symbol is comprised within the at least part of the communication signal.

Preferably, the total number of instances that the at least one symbol is comprised within the at least part of the communication signal are considered to match the pre-defined criterion, if a threshold ratio of the number of these instances divided by the total number of symbols representing data contained in the at least part of the communication signal, has been exceeded.

The term "packet switched communication network" as will be used hereinafter, should be understood to encompass the various types of networks known in the art, such as synchronous and asynchronous transfer networks, for example ATM networks, Ethernet networks, IP networks, frame relaying networks, Metropolitan Area Networks (MAN), Wide Area Networks (WAN), Local Area Network (LAN), packet over SONET/SDH networks, wireless networks and the like.

According to another embodiment of the invention, the pre-defined criterion depends upon which compressing algorithm would be used to compress the at least part of the communication signal, in case the latter comprises data in a non-random distribution.

By still another embodiment of the invention, the compressing algorithm that eventually would be applied for compressing the at least part of the digital signal in case the latter comprises data in a non-random distribution, is selected from among a plurality of compressing algorithms, and the selection is based upon the number of instances that the at least one symbol is comprised in that at least one group e.g. upon the difference between the number of times that the at least one symbol is comprised in that at least part of the communication signal and the pre-defined criterion.

The term "algorithm" as used hereinafter, refers to various ways of handling the communication signals. Such algorithms encompass signal relaying such as demodulation/re-modulation relay, various types of lossy or lossless compression, variable rate compression, transcoding and the like.

By still another embodiment of the invention there is provided an apparatus which comprises:

an input interface adapted to receive a communication signal;

a detector adapted to determine whether at least part of the communication signal comprises data having a non-random distribution;

a compressor adapted to compress the at least part of the communication signal that comprises data having a non-random distribution;

an output interface adapted to enable forwarding of the received communication signal having at least part thereof in its compressed form, towards its respective destination.

In accordance with another embodiment of the invention, the detector is adapted to determine whether the communication signal comprises data having at least partially a non-random distribution, by applying accumulative statistics onto the at least part of the communication signal in order to establish whether the data comprised therein is randomly or at least partially non-randomly distributed within that at least part of the communication signal.

By yet another embodiment of the invention, the detector is adapted to:

count the number of instances that at least one symbol (or at least one combination of symbols) are comprised in the at least part of the communication signal; and if the total number of instances that the at least one symbol matches a selected criterion, to determine that the at least part of the communication signal comprises data having a non-random distribution.

Preferably, the detector is further adapted to determine whether a threshold ratio between the number of instances that a certain symbol is comprised within the at least part of the communication signal and the total number of symbols representing data contained thereat, has been exceeded.

In accordance with yet another embodiment, the compressor is further adapted to select and apply a compressing algorithm based upon information retrieved from the detector.

DETAILED DESCRIPTION OF THE INVENTION

The present invention will be understood and appreciated more fully from the following detailed examples taken in conjunction with the drawings.

Figure 1:
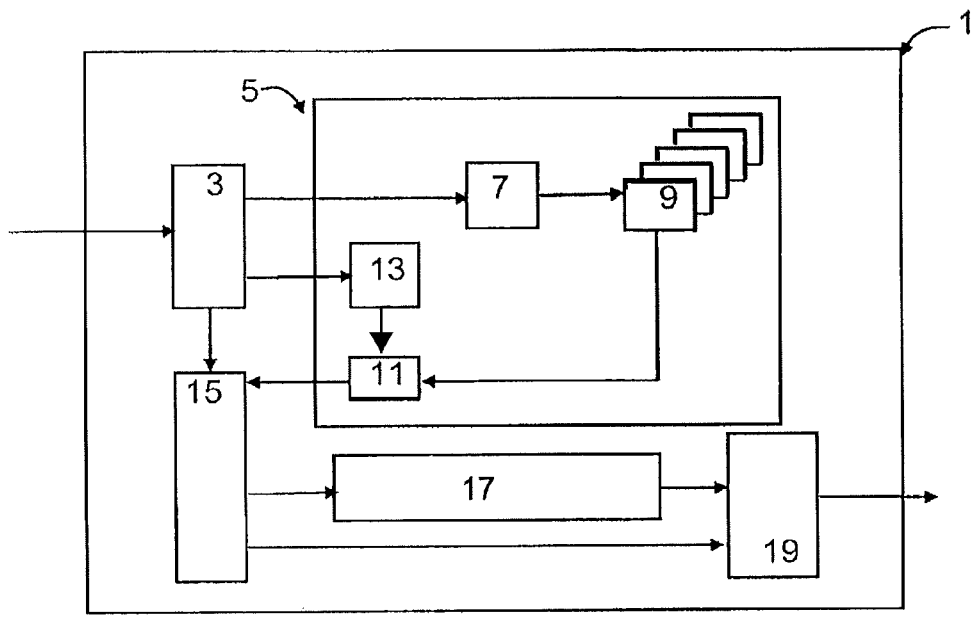
FIG. 1 presents a block diagram showing a structure example of a compressing apparatus according to an embodiment of the invention.

Let us consider now FIG. 1, which presents an example of a schematic block diagram of a compressing apparatus according to an embodiment of the present invention.

Assuming that in a packet switched transmission network, a non-compressed packetized data signal reaches input buffer 3 of compressing device 1, and in order to save bandwidth resources within the network it is desirable to compress the received signal, if possible.

All the received packets, each comprising a part of the signal are forwarded to detector 5, where each of these packets is divided into chunks, e.g. into about 200 bytes. Comparator 7 of detector 5 identifies each of the symbols comprised in the packet payload and counter 9 is then used to count the number of times that each such symbol, e.g. the number of bytes representing a certain character such as a letter, appears in the payload. Decision block 11 compares resulting statistics with a currently known threshold, and provides a decision of whether to compress this data chunk or to transmit it in its uncompressed form. Threshold adapter 13 provides a threshold value that depends on the amount of information that has been accumulated in input buffer 3. Switch 15 conveys the signal towards multiplexor 19 according to the decision taken, either via data compressor 17 which would then compress the data chunk or directly to multiplexor 19 to provide output signal, if no compression is necessary.

As will be appreciated by those skilled in the art, although the present invention is described in this non-limiting example as being carried out for each of the packets independently of its preceding or proceeding packets, still, the same procedure, mutates mutandis, may be carried out for an aggregation of a number of packets, and the conclusions to be drawn, will be based upon the content of the payloads of the aggregated packets.

Let us now assume that a buffer of L bytes is being used. According with an embodiment of the invention, for each of the 256 possible characters the total number of bytes that represent that character is found. Two of the possible options to use the information thus retrieved are the following ones. The first, establishing the number of characters for which the number of representing bytes that are included in the buffer exceeds a pre-defined threshold. If there are more characters than a pre-defined number (depending on the buffer size, L), the buffer is declared to hold part of the signal that comprises a non-random distribution of data. Another possible option is to rank the characters according to the number of times in which they appear in the buffer, to sum the number of times that the top x number of characters (e.g. the top 25% of the characters) appear in the buffer and to determine if the aggregated number of appearances normalized by the buffer size, exceeds a threshold. As will be appreciated by those skilled in the art, the above two options are described merely as examples and other types of more complicated statistic hypothesis checking methods may be used and even provide more reliable detection.

Figure 2:
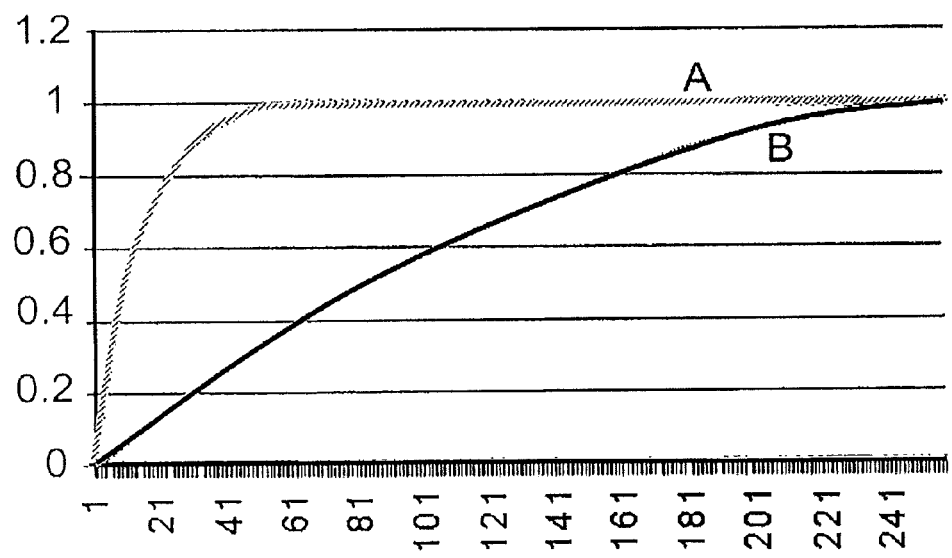
FIG. 2 presents a graph illustrating the difference between random and non-random distributions of data in signals conveyed in a communication network.

FIG. 2 demonstrates the above mechanism, where the vertical axis represents the sum of appearances of the top x numbers of characters ranked by the number of their appearances within the block of data being analyzed and divided by total number of analyzed characters. Number x is used as the horizontal axis. As can be seen in this FIG., in curve "A", which represents compressible data, the number of bytes, which are associated with relatively fewer characters, is higher than this number in a random distribution of data (curve "B").

Now, if the aggregate number of appearances normalized by the buffer size, exceeds the threshold, the distribution of the data within a packet is considered to be a non uniform distribution, and as such the packet may be compressed by any suitable compressing algorithm that is known in the art per se, for example the Ziv-Lempel algorithm, prediction by partial matching algorithm or any other applicable algorithm known in the art. Preferably, the determination of whether the distribution of the data comprised in the at least part of communication signal has at least partially a non-random distribution, includes providing a number of thresholds of non-random distributions, and determining which of these thresholds are exceeded by the distribution of the data comprised in the at least part of communication signal. Based upon the thresholds that are exceeded one may establish which compression algorithm should be used for compressing the at least part of the communication signal, e.g. the more the data comprises non-random distribution, the deeper is the compression that may be applied thereon.

Once the appropriate compressing algorithm is selected, it is applied on that packet thereby reducing the bandwidth required for forwarding of this packet along the transmission path, towards its destination. The compressed packet is then forwarded to packetizer 11 that prepares the packet for conveyance along the transmission path.

Although the above example has been described for a packetized (packet switched) network, it should be understood that the present invention is not restricted to such networks and may be applied to other networks as well (e.g. TDM networks), mutates mutandis.

The use of the terms "random distribution" and "at least partially a non-random distribution" as used herein throughout the specification and claims, should be understood as preferably an empirical quantitative criterion, which is determined through the use of the respective threshold(s). In other words, a determination of whether the data distribution is random or non-random (or partially non-random) amounts essentially to the question if the number of times in which a certain character or characters appears within that signal exceeds one or more thresholds, or not.

It is to be understood that the present invention has been described using non-limiting detailed descriptions of embodiments thereof that are provided by way of example and are not intended to limit the scope of the invention. It should be understood that features and/or steps described with respect to one embodiment may be used with other embodiments and that not all embodiments of the invention have all of the features and/or steps shown in a particular figure or described with respect to one of the embodiments. Variations of embodiments described will occur to persons of the art.

It should be noted that some of the above described embodiments describe the best mode contemplated by the inventors and therefore include structure, acts or details of structures and acts that may not be essential to the invention and which are described as examples. Structure and acts described herein are replaceable by equivalents which perform the same function, even if the structure or acts are different, as known in the art, e.g. the use of a processor to carry out at least some of the functions described as being carried out by the detector of the present invention. Therefore, the scope of the invention is limited only by the elements and limitations as used in the claims. When used in the following claims, the terms "comprise", "include", "have" and their conjugates mean "including but not limited to"

The invention claimed is:

1. A method for determining whether to convey a communication signal in a compressed form along a communication path extending in a communications network, which comprises the steps of:
   providing said communication signal that should be conveyed along said communication path;
   determining whether at least part of said communication signal comprises data having a non-random distribution;
   if the at least part of the communication signal is determined to comprise data having at least partially a non-random distribution, applying a compression algorithm onto said at least part of the communication signal to form a compressed form of the communication signal provided; and
   conveying the communication signal in its compressed form along said communication path.

2. The method according to claim 1, wherein the step of determining whether the at least part of communication signal comprises data having a non-random distribution includes applying accumulative statistics onto said at least part of the communication signal.

3. The method according to claim 1, wherein the step of determining whether at least part of said communication signal comprises data has a non-random distribution, is based upon comparing the number of bytes representing at least one character to a threshold.

4. The method according to claim 1, wherein the step of determining whether the distribution of the data in the at least part of the communication signal has a non-random distribution, includes providing a plurality of thresholds of non-random distributions, determining which of these thresholds are exceeded by the distribution of the data in the at least part of the communication signal, and based upon the thresholds that are exceeded, establishing a compression algorithm to be used for compressing said at least part of the communication signal.

5. The method according to claim 3 or 4, wherein said threshold is an adaptive threshold which depends upon available resources.

6. The method according to claim 1, wherein the step of determining whether at least part of the communication signal comprises data having a non-random distribution, comprises:
   counting number of instances that at least one symbol is within the at least part of the communication signal; and
   if the total number of instances that said at least one symbol within the at least part of the communication signal matches a pre-defined criterion, determining that the at least part of the communication signal comprises data having a non-random distribution.

7. The method according to claim 6, wherein the predefined criterion comprises exceeding a threshold ratio of the number of instances that said at least one symbol is in said at least one group, divided by the total number of symbols representing data contained in the at least part of the communication signal.

8. The method according to claim 6, wherein said predefined criterion depends upon which compressing algorithm would be used to compress the at least part of the communication signal, in case the at least part of the communication signal comprises data having a non-random distribution.

9. The method according to claim 6, wherein said compressing algorithm is selected from among a plurality of compressing algorithms, and wherein said selection is based upon the number of instances that said at least one symbol is within the at least part of the communication signal.

10. A communication apparatus comprising:
- an input interface adapted to receive a communication signal;
- a detector, coupled to said input interface, adapted to determine whether at least part of said received communication signal comprises data having a non-random distribution;
- a switch coupled to said detector and said input interface and adapted to forward said received communication signal through at least one selectable output of a plurality of selectable outputs;
- a compressor having an input coupled to at least one selectable output of said switch and adapted to compress a signal received thereon and provide, at an output, a compressed form of said signal received at said input; and
- an output interface having a first input coupled to at least one selectable output of said switch and a second input coupled to said output of said compressor and adapted to forward a signal received at either of said first and second inputs from a first output, wherein said detector is further adapted to instruct said switch to direct said received communication signal to said compressor when said detector determines that at least part of said received communication signal comprises data having a non-random distribution.

11. The communication apparatus according to claim 10, wherein said detector is adapted to:
- count the number of instances that at least one symbol is in the at least part of the communication signal; and
- if the total number of counted instances that the at least one symbol matches a criterion, to determine that the at least part of the communication signal comprises data having a non-random distribution.

12. The communication apparatus according to claim 11, wherein said detector is further adapted to determine whether a threshold ratio of the number of instances that said at least one symbol is in the at least part of the communication signal, divided by the total number of symbols representing data contained in the at least part of the communication signal, has been exceeded.

13. The communication apparatus according to claim 10, wherein said compressor is adapted to select and apply a compressing algorithm based upon information retrieved from the detector.

* * * * *